United States Patent
Goda et al.

(10) Patent No.: US 11,211,126 B2
(45) Date of Patent: *Dec. 28, 2021

(54) APPARATUS AND METHODS INCLUDING SOURCE GATES

(71) Applicant: Micron Technology, Inc., Boise, ID (US)

(72) Inventors: Akira Goda, Setagaya (JP); Shafqat Ahmed, San Jose, CA (US); Khaled Hasnat, San Jose, CA (US); Krishna K. Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/027,425

(22) Filed: Sep. 21, 2020

(65) Prior Publication Data

US 2021/0174874 A1    Jun. 10, 2021

Related U.S. Application Data

(63) Continuation of application No. 16/237,337, filed on Dec. 31, 2018, now Pat. No. 10,783,967, which is a
(Continued)

(51) Int. Cl.
*G11C 16/04* (2006.01)
*H01L 27/11519* (2017.01)
(Continued)

(52) U.S. Cl.
CPC ...... *G11C 16/0483* (2013.01); *G11C 16/0408* (2013.01); *G11C 16/06* (2013.01);
(Continued)

(58) Field of Classification Search
CPC . G11C 16/0483; G11C 16/0408; G11C 16/06; G11C 16/10; G11C 16/12;
(Continued)

(56) References Cited

U.S. PATENT DOCUMENTS

| | | |
|---|---|---|
| 5,615,152 A | 3/1997 | Bergemont |
| 5,835,396 A | 11/1998 | Zhang |

(Continued)

FOREIGN PATENT DOCUMENTS

| | | |
|---|---|---|
| CN | 101681677 A | 3/2010 |
| CN | 103782344 A | 6/2014 |

(Continued)

OTHER PUBLICATIONS

"Korean Application Serial No. 10-2015-7013333, Notice of Preliminary Rejection dated Jul. 14, 2020", w English Translation, 8 pgs.

(Continued)

*Primary Examiner* — Connie C Yoha
(74) *Attorney, Agent, or Firm* — Schwegman Lundberg & Woessner, P.A.

(57) ABSTRACT

Apparatus and methods are disclosed, such as an apparatus that includes a string of charge storage devices associated with a pillar (e.g., of semiconductor material), a source gate device, and a source select device coupled between the source gate device and the string. Additional apparatus and methods are described.

20 Claims, 7 Drawing Sheets

Related U.S. Application Data continuation of application No. 15/721,007, filed on Sep. 29, 2017, now Pat. No. 10,170,189, which is a continuation of application No. 15/166,029, filed on May 26, 2016, now Pat. No. 9,779,816, which is a continuation of application No. 14/451,145, filed on Aug. 4, 2014, now Pat. No. 9,378,839, which is a continuation of application No. 13/210,194, filed on Aug. 15, 2011, now Pat. No. 8,797,806.

(51) Int. Cl.
*H01L 27/11556* (2017.01)
*H01L 27/11565* (2017.01)
*H01L 27/11582* (2017.01)
*G11C 16/26* (2006.01)
*G11C 16/34* (2006.01)
*G11C 16/12* (2006.01)
*G11C 16/14* (2006.01)
*G11C 16/06* (2006.01)
*G11C 16/10* (2006.01)

(52) U.S. Cl.
CPC .............. *G11C 16/12* (2013.01); *G11C 16/14* (2013.01); *G11C 16/26* (2013.01); *G11C 16/3418* (2013.01); *G11C 16/3427* (2013.01); *H01L 27/11519* (2013.01); *H01L 27/11556* (2013.01); *H01L 27/11565* (2013.01); *H01L 27/11582* (2013.01); *G11C 16/10* (2013.01)

(58) Field of Classification Search
CPC ... G11C 16/14; G11C 16/26; H01L 27/11519; H01L 27/11556; H01L 27/11565; H01L 27/11582
USPC ........................... 365/185.11, 185.23, 230.06
See application file for complete search history.

(56) References Cited

U.S. PATENT DOCUMENTS

| | | | |
|---|---|---|---|
| 5,969,990 A | 10/1999 | Arase | |
| 6,154,391 A | 11/2000 | Takeuchi et al. | |
| 6,272,044 B2 | 8/2001 | Yamamoto et al. | |
| 6,307,781 B1 | 10/2001 | Shum | |
| 6,870,769 B1 | 3/2005 | Ha | |
| 7,023,739 B2 | 4/2006 | Chen et al. | |
| 7,196,930 B2 | 3/2007 | Han et al. | |
| 7,259,991 B2 | 8/2007 | Aritome | |
| 7,433,231 B2 | 10/2008 | Aritome | |
| 7,433,233 B2 | 10/2008 | Chen et al. | |
| 7,440,321 B2 | 10/2008 | Aritome | |
| 7,599,228 B1 | 10/2009 | Lu et al. | |
| 7,626,866 B2 | 12/2009 | Aritome | |
| 7,630,236 B2 | 12/2009 | Han et al. | |
| 7,924,619 B2 | 4/2011 | Aritome | |
| 7,940,564 B2 | 5/2011 | Park et al. | |
| 8,004,885 B2 | 8/2011 | Yun et al. | |
| 8,134,868 B2 * | 3/2012 | Chandrasekhar | G11C 16/26 365/185.03 |
| 8,213,235 B2 | 7/2012 | Kim | |
| 8,237,213 B2 | 8/2012 | Lin | |
| 8,542,533 B2 | 9/2013 | Maejima et al. | |
| 8,599,614 B2 | 12/2013 | Miida et al. | |
| 8,797,806 B2 * | 8/2014 | Goda | G11C 16/12 365/185.26 |
| 9,318,199 B2 | 4/2016 | Abraham et al. | |
| 9,318,200 B2 | 4/2016 | Sakui | |
| 9,378,839 B2 | 6/2016 | Goda et al. | |
| 9,653,171 B2 | 5/2017 | Abraham et al. | |
| 9,779,816 B2 * | 10/2017 | Goda | G11C 16/3427 |
| 10,170,189 B2 * | 1/2019 | Goda | H01L 27/11565 |
| 10,541,029 B2 | 1/2020 | Sakui et al. | |
| 10,783,967 B2 * | 9/2020 | Goda | G11C 16/3427 |
| 2002/0088976 A1 | 7/2002 | Shin et al. | |
| 2004/0190324 A1 | 9/2004 | Yamamura | |
| 2005/0128807 A1 | 6/2005 | Chen et al. | |
| 2005/0232012 A1 | 10/2005 | Park | |
| 2006/0245252 A1 | 11/2006 | Han et al. | |
| 2006/0245263 A1 | 11/2006 | Sakui | |
| 2006/0261404 A1 | 11/2006 | Forbes | |
| 2007/0252201 A1 | 11/2007 | Kito et al. | |
| 2007/0253253 A1 | 11/2007 | Aritome | |
| 2007/0263462 A1 * | 11/2007 | Roohparvar | G11C 16/0483 365/198 |
| 2008/0068875 A1 | 3/2008 | Choi | |
| 2008/0181020 A1 | 7/2008 | Yu et al. | |
| 2008/0219053 A1 | 9/2008 | Kim | |
| 2009/0175083 A1 | 7/2009 | Ajika et al. | |
| 2009/0180324 A1 | 7/2009 | Ramaswamy et al. | |
| 2009/0230454 A1 | 9/2009 | Pekny | |
| 2010/0124116 A1 | 5/2010 | Maeda et al. | |
| 2010/0172179 A1 | 7/2010 | Gorobets | |
| 2010/0207194 A1 | 8/2010 | Tanaka et al. | |
| 2010/0214839 A1 | 8/2010 | Guzzi et al. | |
| 2010/0238732 A1 | 9/2010 | Hishida et al. | |
| 2010/0257308 A1 | 10/2010 | Hsu et al. | |
| 2010/0309729 A1 | 12/2010 | Chang et al. | |
| 2010/0322000 A1 | 12/2010 | Shim et al. | |
| 2011/0049607 A1 | 3/2011 | Yahashi | |
| 2011/0051512 A1 | 3/2011 | Violette | |
| 2011/0141788 A1 | 6/2011 | Balakrishnan et al. | |
| 2011/0194357 A1 | 8/2011 | Hau et al. | |
| 2011/0249503 A1 | 10/2011 | Yamada et al. | |
| 2011/0298011 A1 | 12/2011 | Lee et al. | |
| 2011/0299314 A1 | 12/2011 | Samachisa et al. | |
| 2012/0081957 A1 | 4/2012 | Kim et al. | |
| 2012/0320678 A1 | 12/2012 | Maejima et al. | |
| 2013/0044549 A1 | 2/2013 | Goda | |
| 2013/0272067 A1 | 10/2013 | Lee et al. | |
| 2014/0036590 A1 | 2/2014 | Feeley et al. | |
| 2014/0043915 A1 | 2/2014 | Choi | |
| 2014/0122773 A1 | 5/2014 | Abraham et al. | |
| 2014/0340963 A1 | 11/2014 | Goda et al. | |
| 2015/0206587 A1 | 7/2015 | Hasegawa et al. | |
| 2016/0019970 A1 | 1/2016 | Sakui | |
| 2016/0232979 A1 | 8/2016 | Abraham et al. | |
| 2016/0343438 A1 | 11/2016 | Goda | |
| 2018/0122481 A1 | 5/2018 | Goda et al. | |
| 2019/0279715 A1 | 9/2019 | Goda et al. | |
| 2019/0392907 A1 | 12/2019 | Her et al. | |
| 2020/0152271 A1 | 5/2020 | Sakui et al. | |

FOREIGN PATENT DOCUMENTS

| | | |
|---|---|---|
| CN | 104903964 A | 9/2015 |
| CN | ZL201380062847.6 | 2/2018 |
| EP | 2912665 A1 | 9/2015 |
| EP | 2912665 B1 | 9/2019 |
| EP | 2745295 | 4/2020 |
| JP | 2001135100 A | 5/2001 |
| JP | 2002231835 A | 8/2002 |
| JP | 2002245786 A | 8/2002 |
| JP | 2004326864 A | 11/2004 |
| JP | 2010520571 A | 6/2010 |
| JP | 2010192569 A | 9/2010 |
| JP | 2011016530 A | 1/2011 |
| KR | 20020060490 | 7/2002 |
| KR | 1020020060490 A | 7/2002 |
| KR | 100624596 | 9/2006 |
| KR | 20090128776 | 12/2009 |
| KR | 20100094384 A | 8/2010 |
| KR | 20110042526 A | 4/2011 |
| KR | 1020110132820 A | 12/2011 |
| KR | 10-1866236 | 6/2018 |
| TW | 200849261 A | 12/2008 |
| TW | 201126531 A | 8/2011 |
| TW | 201145300 A | 12/2011 |
| TW | 201209827 A | 3/2012 |
| TW | I590048 | 7/2017 |
| WO | WO-2007005891 A2 | 1/2007 |

(56) References Cited

FOREIGN PATENT DOCUMENTS

| WO | WO-2011019794 A2 | 2/2011 |
|----|------------------|--------|
| WO | WO-2013025710 A1 | 2/2013 |
| WO | WO-2014066829 A1 | 5/2014 |

OTHER PUBLICATIONS

"European Application Serial No. 20170725.4, Extended European Search Report dated Aug. 12, 2020", 8 pgs.
"Korean Application Serial No. 10-2015-7013333, Response filed Nov. 16, 2020 to Notice of Preliminary Rejection dated Jul. 14, 2020", w English Claims, 27 pgs.
U.S. Appl. No. 13/210,194, Non Final Office Action dated Apr. 25, 2013, 10 pgs.
U.S. Appl. No. 13/210,194 , Response filed Jul. 25, 2013 to Non Final Office Action dated Apr. 25, 2013, 11 pgs.
U.S. Appl. No. 13/210,194, Final Office Action dated Sep. 9, 2013, 10 pgs.
U.S. Appl. No. 13/210,194, Examiner Interview Summary dated Sep. 26, 2013, 3 pgs.
U.S. Appl. No. 13/210,194, Response filed Nov. 8, 2013 to Final Office Action dated Apr. 25, 2013, 11 pgs.
U.S. Appl. No. 13/210,194, Notice of Allowance dated Nov. 29, 2013, 12 pgs.
U.S. Appl. No. 13/210,194, Notice of Allowance dated Mar. 18, 2014, 9 pgs.
U.S. Appl. No. 13/564,458, Restriction Requirement dated Feb. 6, 2014, 7 pgs.
U.S. Appl. No. 13/564,458, Response filed Apr. 4, 2014 to Restriction Requirement dated Feb. 6, 2014, 10 pgs.
U.S. Appl. No. 13/564,458, Non Final Office Action dated Aug. 1, 2014, 7 pgs.
U.S. Appl. No. 13/564,458, Response filed Nov. 3, 2014 to Non Final Office Action dated Aug. 1, 2014, 11 pgs.
U.S. Appl. No. 13/564,458, Restriction Requirement dated Mar. 4, 2015, 6 pgs.
U.S. Appl. No. 13/564,458, Response filed May 4, 2015 to Restriction Requirement dated Mar. 4, 2015, 10 pgs.
U.S. Appl. No. 13/564,458, Notice of Allowance dated Oct. 2, 2015, 9 pgs.
U.S. Appl. No. 13/564,458, Non Final Office Action dated Feb. 26, 2016, 6 pgs.
U.S. Appl. No. 13/564,458, Response filed May 26, 2016 to Non Final Office Action dated Feb. 26, 2016, 8 pgs.
U.S. Appl. No. 13/564,458, Final Office Action dated Jun. 14, 2018, 16 pgs.
U.S. Appl. No. 13/564,458, Response filed Dec. 14, 2018 to Final Office Action dated Jun. 14, 2018, 10 pgs.
U.S. Appl. No. 13/564,458, Non Final Office Action dated Feb. 25, 2019, 13 pgs.
U.S. Appl. No. 13/564,458, Response filed Jun. 25, 2019 to Non-Final Office Action dated Feb. 25, 2019, 9 pgs.
U.S. Appl. No. 13/564,458, Notice of Allowance dated Aug. 27, 2019, 9 pgs.
U.S. Appl. No. 13/661,321, Non Final Office Action dated May 8, 2015, 19 pgs.
U.S. Appl. No. 13/661,321, Response filed Aug. 4, 2015 to Non Final Office Action dated May 8, 2015, 18 pgs.
U.S. Appl. No. 13/661,321, Final Office Action dated Sep. 17, 2015, 26 pgs.
U.S. Appl. No. 13/661,321, Response filed Nov. 17, 2015 to Final Office Action dated Sep. 17, 2015, 13 pgs.
U.S. Appl. No. 13/661,321, Notice of Allowance dated Dec. 9, 2015, 5 pgs.
U.S. Appl. No. 14/451,145, Non Final Office Action dated Oct. 1, 2015, 10 pgs.
U.S. Appl. No. 14/451,145, Response filed Dec. 30, 2015 to Non Final Office Action dated Oct. 1, 2015, 9 pgs.
U.S. Appl. No. 14/451,145, Notice of Allowance dated Feb. 29, 2016, 8 pgs.
U.S. Appl. No. 15/131,719, Non Final Office Action dated Jun. 15, 2016, 16 pgs.
U.S. Appl. No. 15/131,719, Response filed Oct. 14, 2016 to Non Final Office Action dated Jun. 15, 2016, 13 pgs.
U.S. Appl. No. 15/131,719, Notice of Allowance dated Jan. 4, 2017, 7 pgs.
U.S. Appl. No. 15/131,719, Amendment Under 37 C.F.R. filed Apr. 4, 2017, 8 pgs.
U.S. Appl. No. 15/131,719, PTO Response to Rule 312 Communication dated Apr. 13, 2017, 2 pgs.
U.S. Appl. No. 15/166,029, Preliminary Amendment filed Aug. 10, 2016, 9 pgs.
U.S. Appl. No. 15/166,029, Non Final Office Action dated Jan. 17, 2017, 10 pgs.
U.S. Appl. No. 15/166,029, Response filed May 17, 2017 to Non Final Office Action dated Jan. 17, 2017, 11 pgs.
U.S. Appl. No. 15/166,029, Notice of Allowance dated Jul. 3, 2017, 8 pgs.
U.S. Appl. No. 15/721,007, Prelimiinary Amendment filed Jan. 16, 2018, 10 pgs.
U.S. Appl. No. 15/721,007, Non Final Office Action dated Mar. 9, 2018, 11 pgs.
U.S. Appl. No. 15/721,007, Response filed Jul. 9, 2018 to Non-Final Office Action dated Mar. 9, 2018, 14 pgs.
U.S. Appl. No. 15/721,007, Notice of Allowance dated Oct. 12, 2018, 9 pgs.
U.S. Appl. No. 16/237,337, Preliminary Amendment filed Jun. 4, 2019, 7 pgs.
U.S. Appl. No. 16/237,337, Non Final Office Action dated Jan. 15, 2020, 7 pgs.
U.S. Appl. No. 16/237,337, Response filed Apr. 15, 2020 to Non Final Office Action dated Jan. 15, 2020, 9 pgs.
U.S. Appl. No. 15/855,780, Notice of Allowance dated May 19, 2020, 9 pgs.
U.S. Appl. No. 16/237,337, Corrected Notice of Allowability dated Aug. 14, 2020, 2 pgs.
"Chinese Application Serial No. 201280043709.9 Response filed Feb. 15, 2015 to Office Action dated Nov. 4, 2014", With the English claims, 14 pgs.
"Chinese Application Serial No. 201280043709.9, Amendment filed Aug. 8, 2014", W/ English Translation, 14 pgs.
"Chinese Application Serial No. 201280043709.9, Office Action dated Nov. 4, 2014", W/ English Translation, 8 pgs.
"Chinese Application Serial No. 201380062847.6, Office Action dated Apr. 27, 2017", w/English Translation, 30 pgs.
"Chinese Application Serial No. 201380062847.6, Response filed Sep. 12, 2017 to Office Action dated Apr. 27, 2017", w/English Claims, 29 pgs.
"European Application Serial No. 12824349.0, Communication Pursuant to Article 94(3) EPC dated Dec. 8, 2017", 5 pgs.
"European Application Serial No. 12824349.0, Communication pursuant to Rules 70(2) and 70a(2) EPC dated Feb. 11, 2016", 1 pg.
"European Application Serial No. 12824349.0, Extended European Search Report dated Jan. 25, 2016", 6 pgs.
"European Application Serial No. 12824349.0, Office Action dated Mar. 26, 2014", 3 pgs.
"European Application Serial No. 12824349.0, Response filed Apr. 18, 2018 to Communication Pursuant to Article 94(3) EPC dated Dec. 8, 2017", w/ English Claims, 14 pgs.
"European Application Serial No. 12824349.0, Response filed Oct. 6, 2014 to Office Action dated Mar. 26, 2014", 30 pgs.
"European Application Serial No. 13848265.8, Extended European Search Report dated Jun. 1, 2016", 7 pgs.
"European Application Serial No. 13848265.8, Response filed Dec. 28, 2016 to Extended European Search Report dated Jun. 1, 2016", 15 pgs.
"European Application Serial No. 13848265.8,Preliminary Amendment filed Dec. 16, 2015", 4 pgs.
"International Application Serial No. PCT/US2012/050783, International Preliminary Report on Patentability dated Feb. 27, 2014", 7 pgs.

(56) References Cited

OTHER PUBLICATIONS

"International Application Serial No. PCT/US2012/050783, International Search Report dated Dec. 17, 2012", 3 pgs.

"International Application Serial No. PCT/US2012/050783, Written Opinion dated Dec. 17, 2012", 5 pgs.

"International Application Serial No. PCT/US2013/066931, International Preliminary Report on Patentability dated May 7, 2015", 9 pgs.

"International Application Serial No. PCT/US2013/066931, International Search Report dated Feb. 10, 2014", 3 pgs.

"International Application Serial No. PCT/US2013/066931, Written Opinion dated Feb. 10, 2014", 7 pgs.

"Japanese Application Serial No. 2014-526130, Office Action dated Aug. 18, 2015", W/ English Translation, 11 pgs.

"Japanese Application Serial No. 2014-526130, Response filed Nov. 18, 2015", W/ English Claims, 14 pgs.

"Japanese Application Serial No. 2015-539863, Office Action dated Feb. 7, 2017", w/English Translation, 8 pgs.

"Japanese Application Serial No. 2015539863, Response filed Mar. 8, 2017 to Office Action dated Feb. 7, 2017", w/English Claims, 16 pgs.

"Korean Application Serial No. 10-2014-7006646, Notice of Preliminary Rejection dated Oct. 19, 2017", With English Translation, 10 pgs.

"Korean Application Serial No. 10-2014-7006646, Response filed Dec. 19, 2017 to Notice of Preliminary Rejection dated Oct. 19, 2017", w/English Claims, 31 pgs.

"Korean Application Serial No. 10-2015-7013333, Notice of Preliminary Rejection dated Dec. 31, 2019", W/English Translation, 8 pgs.

"Korean Application Serial No. 10-2015-7013333, Response filed Mar. 2, 2020 to Notice of Preliminary Rejection dated Dec. 31, 2019", w/ English Claims, 26 pgs.

"Korean Application Serial No. 10-2018-7015781, Office Action dated Apr. 24, 2020", w/English translation, 12 pgs.

"Korean Application Serial No. 10-2018-7015781, Response filed Jun. 24, 2020 to Office Action dated Apr. 24, 2020", w/ English Claims, 19 pgs.

"Taiwanese Application Serial No. 102138824, Office Action dated Nov. 28, 2016", w/English Translation, 7 pgs.

"Taiwanese Application Serial No. 102138824, Response filed Mar. 1, 2017 to Office Action dated Nov. 28, 2016", w/English Translation, 39 pgs.

Jang, J., et al., "Vertical cell array using TCAT(Terabit Cell Array Transistor) technology for ultra high density NAND flash memory", Symposium on VLSI Technology, (2009), 192-193.

U.S. Appl. No. 13/210,194 U.S. Pat. No. 8,797,806, filed Aug. 15, 2011, Apparatus and Methods Including Source Gates.

U.S. Appl. No. 14/451,145 U.S. Pat. No. 9,378,839, filed Aug. 4, 2014, Apparatus and Methods Including Source Gates.

U.S. Appl. No. 15/166,029 U.S. Pat. No. 9,779,816, filed May 26, 2016, Apparatus and Methods Including Source Gates.

U.S. Appl. No. 15/721,007 U.S. Pat. No. 10,170,189, filed Sep. 29, 2017, Apparatus and Methods Including Source Gates.

U.S. Appl. No. 16/237,337 U.S. Pat. No. 10,783,967, filed Dec. 31, 2018, Apparatus and Methods Including Source Gates.

U.S. Appl. No. 13/564,458 U.S. Pat. No. 10,541,029, filed Aug. 1, 2012, Partial Block Memory Operations.

U.S. Appl. No. 16/744,675, filed Jan. 16, 2020, Partial Block Memory Operations.

U.S. Appl. No. 13/661,321 U.S. Pat. No. 9,318,199, filed Oct. 26, 2012, Parital Page Memory Operations.

U.S. Appl. No. 15/131,719 U.S. Pat. No. 9,653,171, filed Apr. 18, 2016, Partial Page Memory Operations.

\* cited by examiner

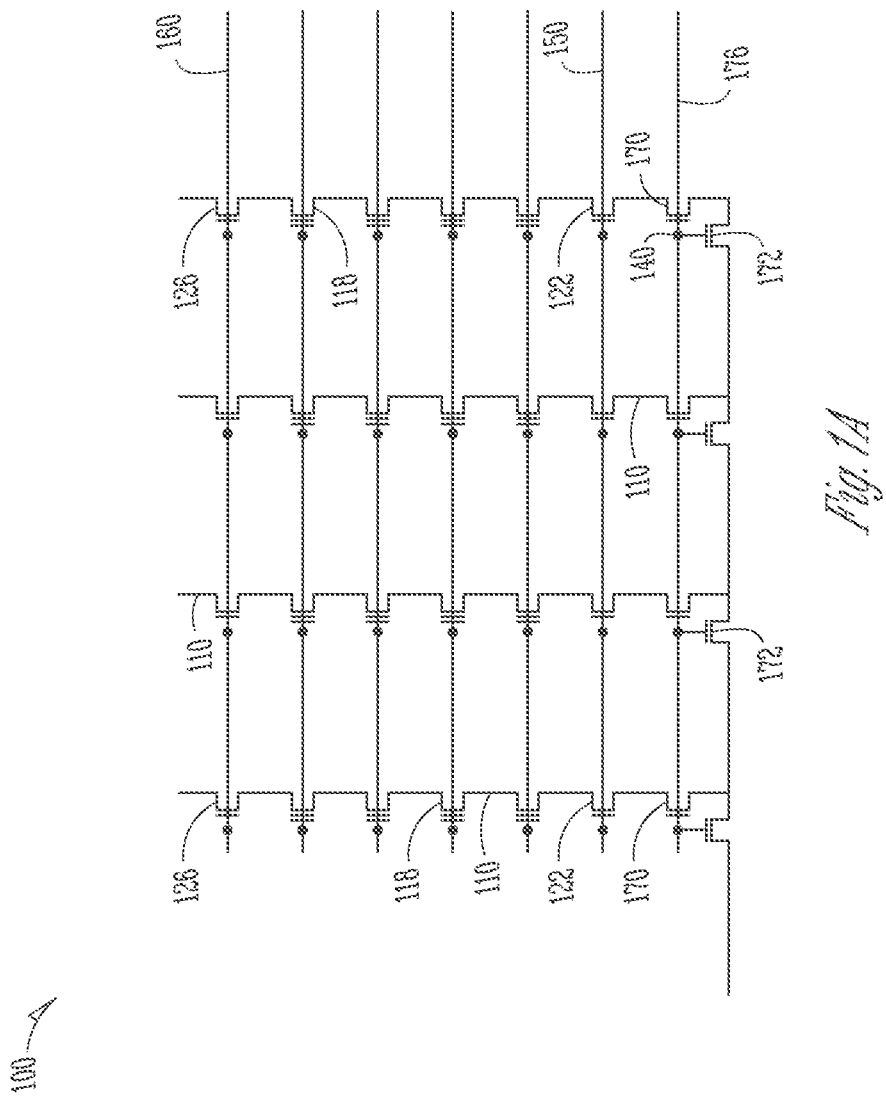

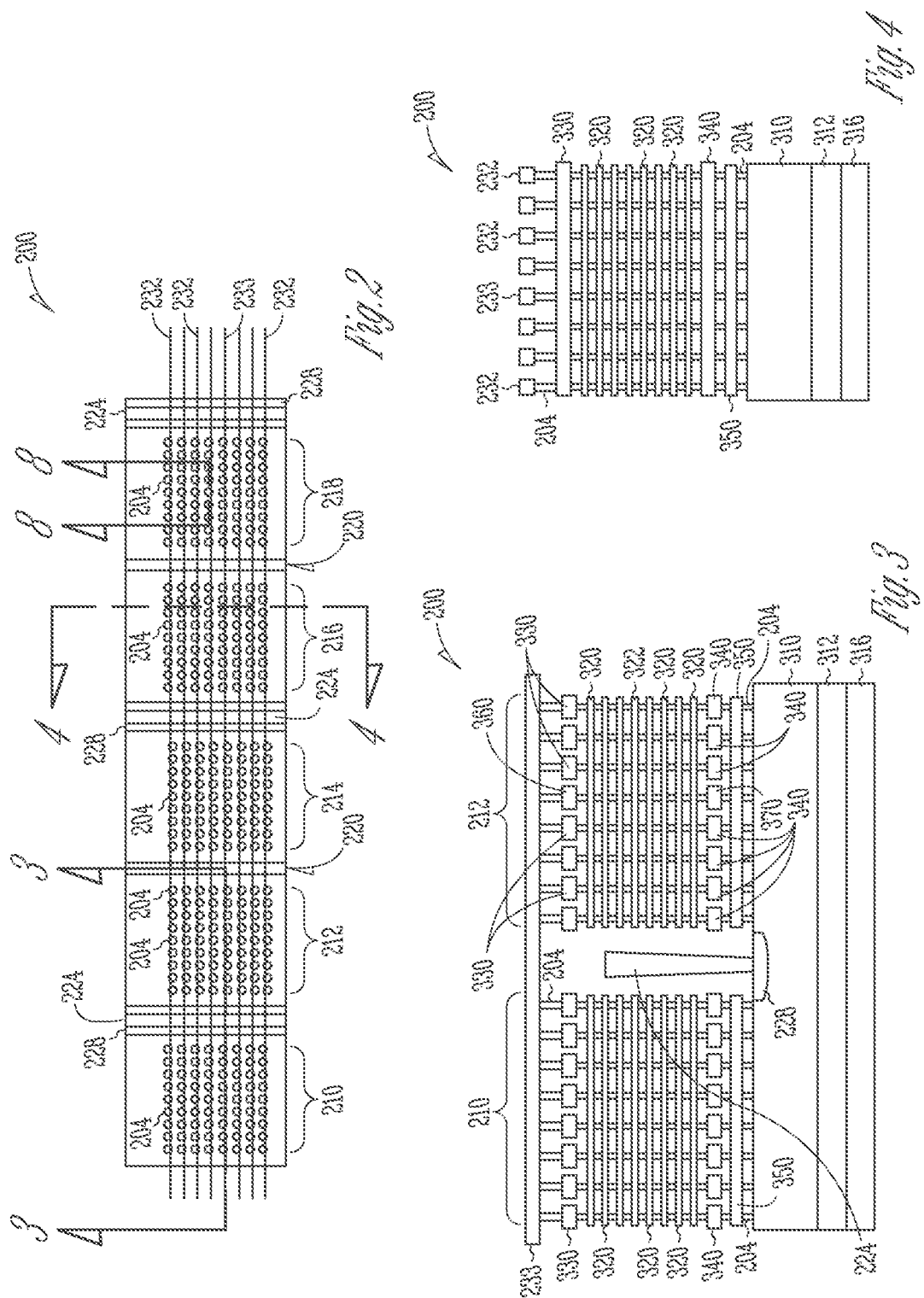

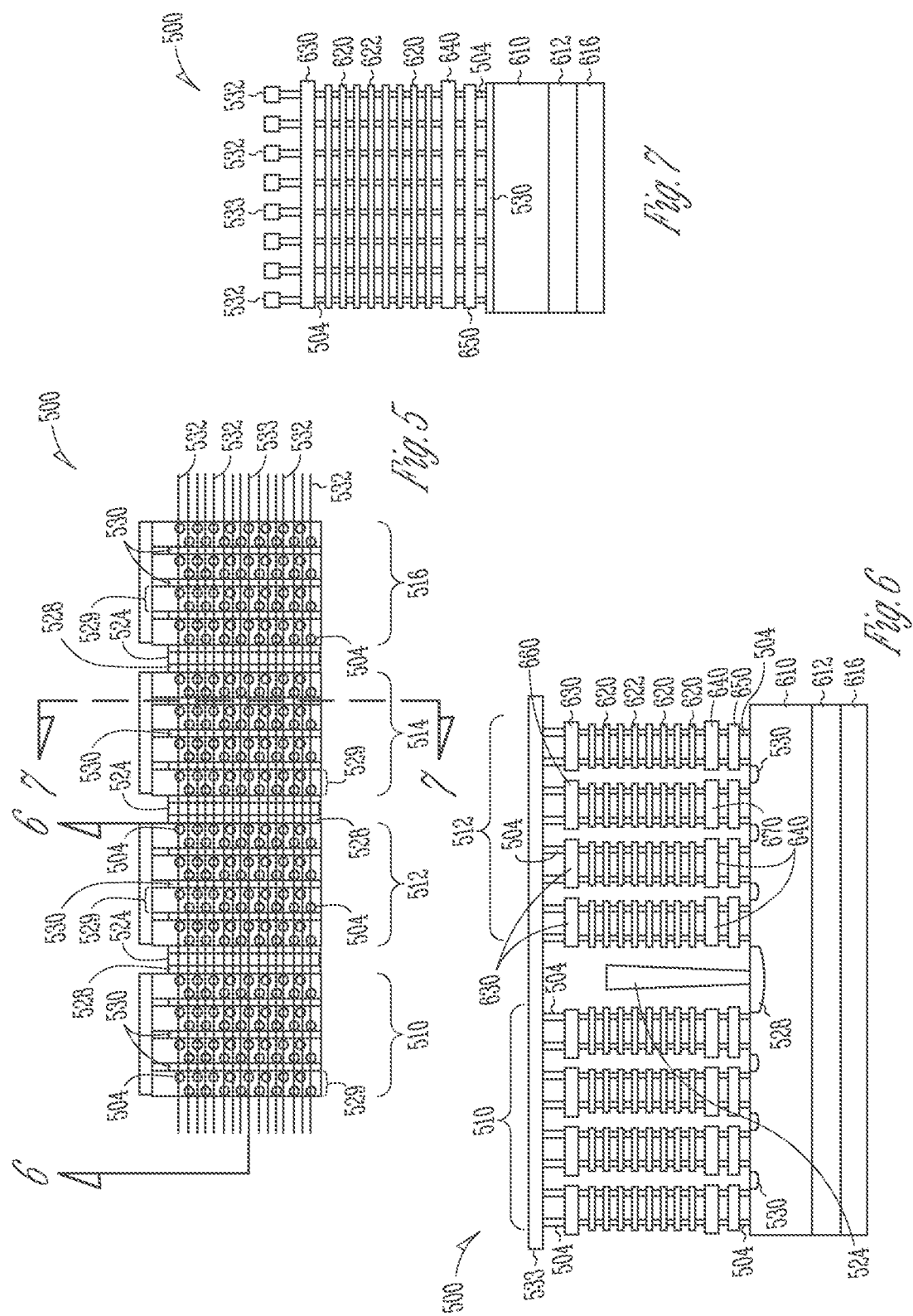

APPARATUS AND METHODS INCLUDING SOURCE GATES

PRIORITY APPLICATION

This application is a continuation of U.S. application Ser. No. 16/237,337, filed Dec. 31, 2018, which is a continuation of U.S. application Ser. No. 15/721,007, filed Sep. 29, 2017, which is a continuation of U.S. application Ser. No. 15/166,029, filed May 26, 2016, which is a continuation of U.S. application Ser. No. 14/451,145, filed Aug. 4, 2014, which is a continuation of U.S. application Ser. No. 13/210,194, filed Aug. 15, 2011, now issued as U.S. Pat. No. 8,797,806, all of which are incorporated herein by reference in their entirety.

BACKGROUND

Semiconductor memory devices are used in many electronic devices such as personal digital assistants (PDAs), laptop computers, mobile phones and digital cameras. Some of these semiconductor memory devices have arrays of charge storage transistors.

BRIEF DESCRIPTION OF THE DRAWINGS

Some embodiments are illustrated by way of example and not limitation in the figures of the accompanying drawings in which:

FIGS. 1A and 1B are electrical schematic diagrams of a block of memory cells according to various embodiments of the invention;

FIG. 2 is a top view of a semiconductor construction according to various embodiments of the invention;

FIG. 3 is a cross-sectional view of a semiconductor construction according to various embodiments of the invention;

FIG. 4 is a cross-sectional view of a semiconductor construction according to various embodiments of the invention;

FIG. 5 is a top view of a semiconductor construction according to various embodiments of the invention;

FIG. 6 is a cross-sectional view of a semiconductor construction according to various embodiments of the invention;

FIG. 7 is a cross-sectional view of a semiconductor construction according to various embodiments of the invention;

DETAILED DESCRIPTION

An array of charge storage devices according to various embodiments of the invention may function as an array of memory cells in a memory device such as a NOT AND (NAND) memory device.

For the purposes of this document, a "tier of semiconductor material" can mean semiconductor material formed in a same plane, rank, row, or unit, such as in a horizontal or vertical or sloped plane, row, rank or unit of a structure. Meanwhile, an "apparatus" can refer to circuitry, devices or systems.

Figure 1B:
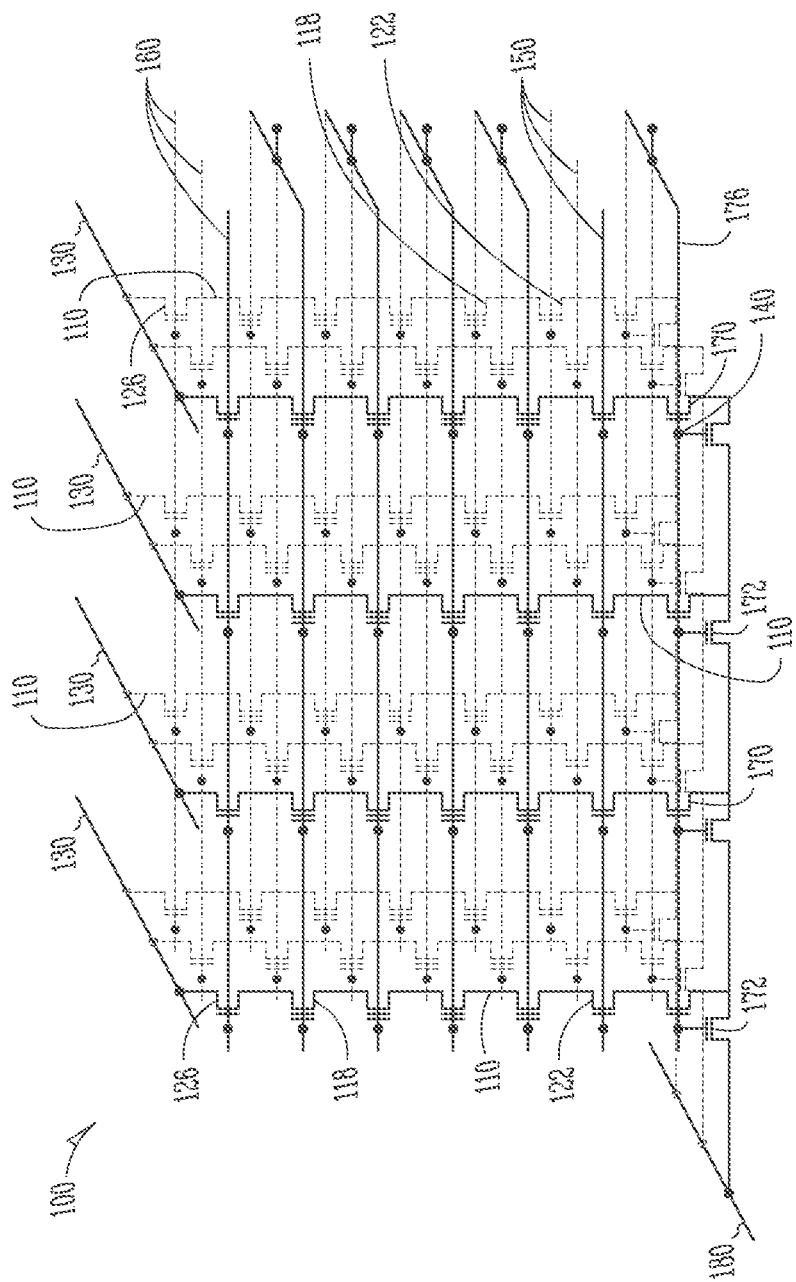

FIGS. 1A and 1B are electrical schematic diagrams of a block 100 of memory cells according to various embodiments of the invention. The block 100 includes strings 110 of charge storage devices 118. A single NAND memory device may include multiple strings.

The strings 110 are arranged in rows and columns in the block 100. FIG. 1A shows a single row of four strings 110 aligned with one vertical plane of the block 100 of memory cells. FIG. 1B shows three rows each having four strings 110 (for a total of twelve strings 110). Each string 110 includes four charge storage devices 118 coupled serially, although each string 110 may include fewer or more charge storage devices 118. Each string 110 includes a source select device 122 at a bottom of the string 110 and a drain select device 126 at a top of the string 110.

The drain select device 126 is coupled between the charge storage devices 118 and a data line 130. There are four data lines 130 that are coupled to the strings 110, each data line 130 being coupled to three of the strings 110 in a column of the block 100. The source select device 122 is coupled between the charge storage devices 118 and a source gate 140.

The source select device 122 has a source select gate (SGS) coupled to a SGS line 150. There are three SGS lines 150 that are coupled to the source select devices 122 in the block 100, each SGS line 150 being coupled to gates of four of the source select devices 122 in a row of the block 100. The SGS lines 150 are substantially orthogonal to the data lines 130.

The drain select device 126 has a drain select gate (SGD) coupled to a SGD line 160. There are three SGD lines 160 that are coupled to the drain select devices 126 in the block 100, each SGD line 160 being coupled to gates of four of the drain select devices 126 in a row of the block 100. The SGD lines 160 are substantially orthogonal to the data lines 130. The source gate 140 substantially controls conduction in a first channel in the string 110 represented by a first source gate device 170 and a second channel in a substrate (not shown) represented by a second source gate device 172. The source gates 140 of all of the strings 110 in the block 100 are coupled to a single source gate line 176. The second source gate devices 172 in each row of the block 100 are coupled in series between the respective strings 110 and a common source line 180.

Each of the charge storage devices 118 may comprise a transistor having a charge trap or a floating gate, for example. Each charge storage device 118 may comprise a multi-state device capable of holding multiple separate and distinct threshold voltage states (e.g., corresponding to respective ranges of threshold voltages), each threshold voltage state representing different data. Each of the source select device 122 and the drain select device 126 may comprise a transistor.

FIG. 2 is a top view of a semiconductor construction 200 according to various embodiments of the invention. The semiconductor construction 200 includes three-hundred and sixty pillars 204 comprising a semiconductor material. For example, the pillars 204 may comprise polysilicon. Each of the pillars 204 provides a channel for multiple charge storage devices in a string in a NAND memory device.

The pillars 204 are arranged into eight rows of forty five columns with each pillar 204 occupying an intersection of a row and a column. The pillars 204 are divided into five blocks 210, 212, 214, 216 and 218 separated from each other by either empty space 220 or a conductive member (e.g., a conductive slot) 224 coupled to an n+ type diffusion region 228. The empty space 220 and space around the members 224 are filled with a dielectric (not shown) such as, for example, silicon dioxide ($SiO_2$). Each of the blocks 210, 212, 214, 216 and 218 includes seventy two of the pillars 204 in eight rows of nine columns. The pillars 204 in each row across all of the blocks 210, 212, 214, 216 and 218 are coupled together by a data line 232 or 233 that may be used to sense a state of one of the charge storage devices in the row. The data lines 232 and 233 may comprise, for example, polysilicon or metal, including one or more of cobalt (Co), titanium (Ti), tungsten (W), nickel (Ni) or tantalum (Ta) according to various embodiments of the invention. The semiconductor construction 200 can include different numbers of pillars 204 arranged in different numbers of rows and columns in different numbers of blocks according to various embodiments of the invention.

FIG. 3 is a cross-sectional view of the semiconductor construction 200 along line 3-3 according to various embodiments of the invention and FIG. 4 is a cross-sectional view of the semiconductor construction 200 along line 4-4 according to various embodiments of the invention. FIG. 3 illustrates the pillars 204 in blocks 210 and 212 and one of the members 224 between the blocks 210 and 212. FIG. 4 illustrates the pillars 204 in the block 216.

The pillars 204 extend from the data lines 232 and 233 to a p-type silicon well 310. The silicon well 310 is formed in an n-type silicon well 312 which is formed in a p-type silicon substrate 316. The n+ type diffusion region 228 is formed in the silicon well 310 and can reduce resistance to current flow in the silicon well 310. A number of tiers of metal or semiconductor material surround or partially surround the pillars 204 between the data lines 232 and 233 and the silicon well 310 in each of the blocks 210, 212, 214, 216 and 218. The tiers are separated from each other by a dielectric (not shown) such as, for example, silicon dioxide ($SiO_2$). A majority of the tiers are access lines 320 and 322 to control the charge storage devices that receive and release charge through the pillars 204. Each of the access lines 320 and 322 surrounds or partially surrounds all of the pillars 204 in a block such as the blocks 210 and 212 shown in FIG. 3.

A tier between the access lines 320 and 322 and the data lines 232 and 233 is divided into drain select gates (SGDs) 330 and 360 that may substantially control conduction between the pillars 204 and the data lines 232 and 233. The eight pillars 204 in each column are surrounded or partially surrounded by a separate SGD 330 or 360. A tier below the access lines 320 and 322 is divided into source select gates (SGSs) 340 and 370 that may at least partially control conduction between the pillars 204 and the silicon well 310. The eight pillars 204 in each column are surrounded or partially surrounded by a separate SGS 340 or 370.

A tier between the SGSs 340 and 370 and the silicon well 310 comprises a source gate 350. In the embodiment depicted in FIGS. 2-4, source gate 350 surrounds or partially surrounds all of the pillars 204 in a block such as the block 210 or the block 212 shown in FIG. 3. The source gate 350 may at least partially control conduction between the pillars 204 and the silicon well 310.

The members 224 each comprise a conductive structure, such as one having a wall shape, coupled to the n+ type diffusion region 228 in the silicon well 310, and that projects from the substrate 316. The members 224 comprise, for example, a semiconductor such as polysilicon or a metal such as tungsten. Each member 224 and the n+ type diffusion region 228 coupled to the member 224 can be used as a common source line in the semiconductor construction 200. The members 224 can be used to bias the silicon well 310 to a potential as desired. The members 224 can also reduce the resistance to current flow in the silicon well 310.

The access lines 320 and 322, the SGDs 330 and 360, the SGSs 340 and 370 and the source gate 350 can be separated from each other by a dielectric such as, for example, silicon dioxide ($SiO_2$). The access lines 320 and 322, the SGDs 330 and 360, the SGSs 340 and 370 and the source gate 350 may comprise tiers of a semiconductor material such as silicon or polysilicon or polysilicon doped with Phosphorous or Boron. The access lines 320 and 322, the SGDs 330 and 360, the SGSs 340 and 370 and the source gate 350 may also comprise metal including one or more of Cobalt (Co), Titanium (Ti), Tungsten (W), Nickel (Ni) or Tantalum (Ta) according to various embodiments of the invention.

The access lines 320 and 322 control charge storage devices surrounding or partially surrounding each pillar 204. Each charge storage device may comprise, for example, a floating gate transistor or a charge trap transistor. The SGDs 330 and 360, the SGSs 340 and 370 and the source gate 350 control transistors surrounding or partially surrounding each pillar 204.

Operations involving charge storage devices in the semiconductor construction 200 will be described with reference to a selected charge storage device having a channel in a selected pillar 204 between the SGD 360 and the SGS 370 in the block 212. The selected pillar 204 is coupled to the data line 233. The selected charge storage device is controlled by the access line 322.

The selected charge storage device is read when the voltages shown in Table 1 are applied to the semiconductor construction 200.

TABLE 1

|  | Block 212 | Block 210 |
| --- | --- | --- |
| Data line 233 | ~0.3 V | ~0.3 V |
| Data lines 232 | ~0 V | ~0 V |
| Access line 322 | 0 to ~3 V | ~0 V |
| Access lines 320 | ~6 V | ~0 V |
| SGD 360 | ~4 V | N/A |
| SGDs 330 | ~0 V | ~0 V |
| SGS 370 | ~4 V | N/A |
| SGSs 340 | ~0 V | ~0 V |
| Source gate 350 | ~5 V | ~0 V |
| Member 224 | ~0 V | ~0 V |
| Silicon Well 310 | ~0 V | ~0 V |

Approximately 4 volts is applied to turn on the SGD 360 and the SGS 370 and approximately 5 volts is applied to turn on the source gate 350 in the block 212 to couple the selected pillar 204 to the data line 233 and the silicon well 310. A channel develops in the silicon well 310 under the block 212 due to the potential of the source gate 350 to carry charge from the block 212 to the member 224 and the n+ type diffusion region 228 coupled to the member 224 that can be a common source line. The access line 322 in the block 212 is coupled to between approximately 0 volts and approximately 3 volts in stages to gradually turn on the selected charge storage device, which can be in one of a plurality of charge storage states. Approximately 6 volts are applied to the other access lines 320 in the block 212 to render the other charge storage devices associated with the selected pillar 204 conductive. The other SGDs 330 and SGSs 340 in the block 212 are coupled to approximately 0 volts and are not conductive, such that the channel does not receive charge from the pillars 204 other than the selected pillar 204. The data line 233 is precharged to approximately 0.3 volts to allow the selected charge storage device to be read, and the other data lines 232 are at approximately 0 volts. The access lines 320, the SGDs 330, the SGSs 340 and the source gate 350 in the block 210 are at approximately 0 volts. The data lines 232 and 233 and the silicon well 310 are at the same potential for the blocks 210 and 212.

Charge storage devices associated with pillars other than the selected pillar 204 can be influenced during a read by the access lines 320 at approximately 6 volts, and may be programmed unintentionally. This unintentional programming is called read disturb. The inventors have discovered that the challenge noted above, as well as others, can be addressed by turning on the source gate 350 at 5 volts to allow the SGSs 340 of the pillars other than the selected pillar 204 to be turned off to substantially electrically isolate the pillars other than the selected pillar 204 from the silicon well 310. The SGSs 340 that are not conductive substantially prevent conduction between the pillars other than the selected pillar 204 and the silicon well 310 to substantially prevent read disturb activity with respect to those pillars 204.

The selected charge storage device is programmed when the voltages shown in Table 2 are applied to the semiconductor construction 200.

TABLE 2

|  | Block 212 | Block 210 |
| --- | --- | --- |
| Data line 233 | 0 to ~1 V | 0 to ~1 V |
| Data lines 232 | ~2.3 V | ~2.3 V |
| Access line 322 | ~20 V | ~0 V |
| Access lines 320 | ~10 V | ~0 V |
| SGD 360 | ~3 V | N/A |
| SGDs 330 | ~0 V | ~0 V |
| SGS 370 | 0 to ~3 V | N/A |
| SGSs 340 | 0 to ~3 V | ~0 V |
| Source gate 350 | ~0 V | ~0 V |
| Member 224 | 0 to ~2 V | 0 to ~2 V |
| Silicon Well 310 | ~0 V | ~0 V |

Approximately 3 volts is applied to turn on the SGD 360. The SGSs 340 and 370 in the block 212 are biased to between approximately 0 and approximately 3 volts and the member 224 is biased to between approximately 0 and approximately 2 volts. The SGDs 330 and the source gate 350 in the block 212 and the silicon well 310 are biased to approximately 0 volts. Approximately 20 volts are applied to the access line 322 in the block 212 to turn on the selected charge storage device to program it. Approximately 10 volts are applied to the other access lines 320 in the block 212 to render the other charge storage devices associated with the selected pillar 204 conductive. The SGDs 330 that are biased to approximately 0 volts are not conductive such that the pillars in the block 212 other than the selected pillar 204 are floating and have a potential that rises to approximately 8 volts due to the potential on the access lines 320 of approximately 10 volts to substantially prevent programming. The data line 233 coupled to the selected pillar 204 is between approximately 0 and approximately 1 volt to allow the selected charge storage device to be programmed and the other data lines 232 are biased to approximately 2.3 volts. The access lines 320, the SGDs 330, the SGSs 340 and the source gate 350 in the block 210 are at approximately 0 volts. The data lines 232 and 233 and the silicon well 310 are at the same potential for the blocks 210 and 212.

The source gate 350 is switched off to substantially reduce leakage of current to the n+ type diffusion region 228 and the member 224 and this can reduce program disturb activity during programming operations. The voltage applied to the SGSs 340 and 370 can be higher than the approximately 3 volts to reduce an electromagnetic field between the SGSs 340 and 370 and the access lines 320 and 322.

The selected charge storage device is erased when the voltages shown in Table 3 are applied to the semiconductor construction 200.

TABLE 3

|  | Block 212 | Block 210 |
| --- | --- | --- |
| Data lines 232, 233 | ~20 V | ~20 V |
| Access lines 320, 322 | ~0 V | ~20 V |
| SGDs 330, 360 | ~20 V | ~20 V |
| SGSs 340, 370 | ~20 V | ~20 V |
| Source gate 350 | ~20 V | ~20 V |
| Member 224 | ~20 V | ~20 V |
| Silicon Well 310 | ~20 V | ~20 V |

Approximately 20 volts is applied to the silicon well 310 such that the potential on the pillars 204 rises to approximately 20 volts. The SGSs 340 and 370, the member 224, the source gate 350, the SGDs 330 and 360 and the data lines 232 and 233 are left floating and rise to approximately 20 volts from capacitive coupling with the pillars 204. Approximately 0 volts are applied to the access lines 320 and 322 in the block 212 to erase the charge storage devices associated with the pillar 204 above the SGS 370. The access lines 320 in the block 210 are also left floating and rise to approximately 20 volts from capacitive coupling with the pillars 204.

FIG. 5 is a top view of a semiconductor construction 500 according to various embodiments of the invention. The semiconductor construction 500 includes two-hundred and fifty-six pillars 504 comprising a semiconductor material. For example, the pillars 504 may comprise polysilicon. Each of the pillars 504 provides a channel for multiple charge storage devices in a string in a NAND memory device.

The pillars 504 are divided into four blocks 510, 512, 514 and 516 separated from each other by a conductive member 524 coupled to an n+ type diffusion region 528. Each of the blocks 510, 512, 514 and 516 includes 64 of the pillars 504 separated into sub-blocks 529, each sub-block 529 including 16 of the pillars 504. Each sub-block 529 is separated from neighboring sub-blocks 529 in the same block by an n+ type diffusion region 530. Sixteen data lines 532 and 533 are coupled to tops of the pillars 504, and the pillars 504 are arranged in two staggered columns in each sub-block 529. The columns of the pillars 504 are substantially perpendicular to the data lines 532 and 533 such that each data line 532 and 533 is coupled to a top of only one of the pillars 504 in each sub-block 529 of the semiconductor construction 500. Each data line 532 and 533 may be used to sense a state of one of the charge storage devices in one of the sub-blocks 529. The data lines 532 and 533 may comprise, for example, polysilicon or metal, including one or more of cobalt (Co), titanium (Ti), tungsten (W), nickel (Ni) or tantalum (Ta), according to various embodiments of the invention.

FIG. 6 is a cross-sectional view of the semiconductor construction 500 along line 6-6 according to various embodiments of the invention and FIG. 7 is a cross-sectional view of the semiconductor construction 500 along line 7-7 according to various embodiments of the invention. FIG. 6 shows the pillars 504 in the blocks 510 and 512 and one of the members 524 between the blocks 510 and 512. Half of the pillars 504 in the blocks 510 and 512 are shown in cross-section and half of the pillars 504 in the blocks 510 and 512 are not shown in cross-section but are staggered and behind the pillars 504 shown in cross-section. The pillars 504 that are staggered and behind the pillars 504 shown in cross-section are coupled to a data line 532 behind the data line 533 shown in FIG. 6. FIG. 7 shows eight of the pillars 504 and half of the data lines 532 and 533 in block 514 for purposes of brevity and clarity.

The pillars 504 extend from the data lines 532 and 533 to a p-type silicon well 610. The silicon well 610 is formed in an n-type silicon well 612 which is formed in a p-type silicon substrate 616. The n+ type diffusion regions 528 and 530 are formed in the silicon well 610 and can reduce resistance to current flow in the silicon well 610. A number of tiers of metal or semiconductor material surround or partially surround the pillars 504 between the data lines 532 and 533 and the silicon well 610 in each of the blocks 510, 512, 514 and 516. The tiers are separated from each other by a dielectric (not shown) such as, for example, silicon dioxide ($SiO_2$). A majority of the tiers comprise access lines 620 and 622 to control the charge storage devices that receive and release charge through the pillars 504. All of the pillars 504 in a sub-block 529 are surrounded or partially surrounded by respective access lines 620 or 622.

A tier between the access lines 620 and 622 and the data lines 532 and 533 is divided into SGDs 630 and 660 that may substantially control conduction between the pillars 504 and the data lines 532 and 533. The pillars 504 in each sub-block 529 are surrounded or partially surrounded by a separate SGD 630 or 660. A tier below the access lines 620 and 622 is divided into SGSs 640 and 670 that may at least partially control conduction between the pillars 504 and the silicon well 610. The pillars 504 in each sub-block 529 are surrounded or partially surrounded by a separate SGS 640 or 670. A tier between the SGSs 640 and 670 and the silicon well 610 is a source gate 650. The pillars 504 in each sub-block 529 are surrounded or partially surrounded by a separate source gate 650. The source gates 650 may also at least partially control conduction between the pillars 504 and the silicon well 610.

The members 524 each comprise a conductive structure, such as one having a wall shape, coupled to the n+ type diffusion region 528 in the silicon well 610, and that projects from the substrate 616. The members 524 comprise, for example, a semiconductor such as polysilicon or a metal such as tungsten. Each member 524 and the n+ type diffusion region 528 coupled to the member 524 can be used as a common source line in the semiconductor construction 500. The members 524 can be used to bias the silicon well 610 to a potential as desired. The members 524 can also reduce the resistance to current flow in the silicon well 610.

The access lines 620 and 622, the SGDs 630 and 660, the SGSs 640 and 670 and the source gate 650 can be separated from each other by a dielectric such as, for example, silicon dioxide ($SiO_2$). The access lines 620 and 622, the SGDs 630 and 660, the SGSs 640 and 670 and the source gate 650 may comprise tiers of a semiconductor material such as silicon or polysilicon or polysilicon doped with Phosphorous or Boron. The access lines 620 and 622, the SGDs 630 and 660, the SGSs 640 and 670 and the source gate 650 may also comprise metal including one or more of cobalt (Co), titanium (Ti), tungsten (W), nickel (Ni) or tantalum (Ta) according to various embodiments of the invention. The access lines 620 and 622 control charge storage devices associated with each pillar 504. The SGDs 630 and 660, the SGSs 640 and 670 and the source gate 650 control transistors surrounding or partially surrounding each pillar 504. Each charge storage device may comprise, for example, a floating gate transistor or a charge trap transistor.

Operations involving charge storage devices in the semiconductor construction 500 will be described with reference to a selected charge storage device having a channel in a selected pillar 504 between the SGD 660 and the SGS 670 in the block 512. The selected pillar 504 is coupled to the data line 533. The selected charge storage device is controlled by the access line 622.

The selected charge storage device is read when the voltages shown in Table 4 are applied to the semiconductor construction 500.

TABLE 4

|  | Block 512 | Block 510 |
| --- | --- | --- |
| Data line 533 | ~0.3 V | ~0.3 V |
| Data lines 532 | ~0 V | ~0 V |
| Access line 622 | 0 to ~3 V | ~0 V |
| Access lines 620 | ~6 V | ~0 V |
| SGD 660 | ~4 V | ~0 V |
| SGDs 630 | ~0 V | ~0 V |
| SGS 670 | ~4 V | ~0 V |
| SGSs 640 | ~0 V | ~0 V |
| Source gate 650 | ~5 V | ~0 V |
| Member 524 | ~0 V | ~0 V |
| Silicon Well 610 | ~0 V | ~0 V |

Approximately 4 volts is applied to turn on the SGD 660 and the SGS 670 and approximately 5 volts is applied to turn on the source gates 650 in the block 512 to couple the selected pillar 504 to the data line 533 and the silicon well 610. A channel develops in the silicon well 610 under the block 512 due to the potential of the source gate 650 to carry charge from the block 512 to the member 524 and the n+ type diffusion region 528 coupled to the member 524 that can be a common source line. The access line 622 in the block 512 is biased to a potential from approximately 0 to approximately 3 volts in stages to gradually turn on the selected charge storage device, which can be in one of a plurality of charge storage states. Approximately 6 volts are applied to the other access lines 620 in the block 512 and render the other charge storage devices associated with the selected pillar 504 conductive. The other SGDs 630 and SGSs 640 in the block 512 are biased to approximately 0 volts and are not conductive such that the channel does not receive charge from the pillars 504 other than the selected pillar 504. The data line 533 is precharged to approximately 0.3 volts to allow the selected charge storage device to be read, and the other data lines 532 are at approximately 0 volts. The access lines 620, the SGDs 630, the SGSs 640 and the source gate 650 in the block 510 are at approximately 0 volts. The data lines 532 and 533 and the silicon well 610 are at the same potential for the blocks 510 and 512. The pillar 504 that is between the SGD 660 and the SGS 670 that is not selected is not selected because it's coupled to one of the data lines 532 at approximately 0V.

The source gates 650 in the block 512 are turned on at 5 volts to allow the SGSs 640 of the pillars other than the selected pillar 504 to be turned off to substantially electrically isolate the pillars other than the selected pillar 504 from the silicon well 610. The SGSs 640 that are not conductive substantially prevent conduction between the pillars other than the selected pillar 504 and the silicon well 610 to substantially prevent read disturb in those pillars.

The selected charge storage device is programmed when the voltages shown in Table 5 are applied to the semiconductor construction 500.

TABLE 5

|  | Block 512 | Block 510 |
| --- | --- | --- |
| Data line 533 | 0 to ~1 V | 0 to ~1 V |
| Data lines 532 | ~2.3 V | ~2.3 V |
| Access line 622 | ~20 V | ~0 V |
| Access lines 620 | ~10 V | ~0 V |
| SGD 660 | ~3 V | N/A |
| SGDs 630 | ~0 V | ~0 V |
| SGS 670 | 0 to ~3 V | N/A |
| SGSs 640 | 0 to ~3 V | ~0 V |
| Source gate 650 | ~0 V | ~0 V |
| Member 524 | 0 to ~2 V | 0 to ~2 V |
| Silicon Well 610 | ~0 V | ~0 V |

Approximately 3 volts is applied to turn on the SGD 660 in the block 512. The SGSs 640 and 670 in the block 512 are biased to between approximately 0 and approximately 3 volts and the member 524 is biased to between 0 and approximately 2 volts. The SGDs 630 and the source gate 650 in the block 512 and the silicon well 610 are biased to approximately 0 volts. Approximately 20 volts are applied to the access line 622 in the block 512 to turn on the selected charge storage device to program it. Approximately 10 volts are applied to the other access lines 620 in the block 512 and render the other charge storage devices associated with the selected pillar 504 conductive. The SGDs 630 in the block 512 that are biased to approximately 0 volts are not conductive, such that the pillars other than the selected pillar 504 are floating and have a potential that rises to approximately 8 volts due to the potential on the access lines 620 of approximately 10 volts to substantially prevent programming. The data line 533 coupled to the selected pillar 504 is between approximately 0 volts and approximately 1 volt to allow the selected charge storage device to be programmed and the other data lines 532 are biased to approximately 2.3 volts. The access lines 620, the SGDs 630, the SGSs 640 and the source gate 650 in the block 510 are at approximately 0 volts. The data lines 532 and 533 and the silicon well 610 are at the same potential for the blocks 510 and 512.

The source gate 650 in the block 512 is switched off to substantially reduce leakage of current to the n+ type diffusion region 528 and the member 524 and this can reduce program disturb activity during the programming. The voltage applied to the SGSs 640 and 670 can be higher than the approximately 3 volts, such as to reduce an electromagnetic field between the SGSs 640 and 670 and the access lines 620 and 622.

The selected charge storage device is erased when the voltages shown in Table 6 are applied to the semiconductor construction 500.

TABLE 6

|  | Block 512 | Block 510 |
| --- | --- | --- |
| Data lines 532, 533 | ~20 V | ~20 V |
| Access lines 620, 622 | ~0 V | ~20 V |
| SGDs 630, 660 | ~20 V | ~20 V |
| SGSs 640, 670 | ~20 V | ~20 V |
| Source gate 650 | ~20 V | ~20 V |
| Member 524 | ~20 V | ~20 V |
| Silicon Well 610 | ~20 V | ~20 V |

Approximately 20 volts is applied to the silicon well 610 such that the potential on the pillars 504 rises to approximately 20 volts. The SGSs 640 and 670, the member 524, the source gate 650, the SGDs 630 and 660 and the data lines 532 and 533 are left floating and rise to approximately 20 volts from capacitive coupling with the pillars 504. Approximately 0 volts are applied to the access lines 620 and 622 in the block 512 to erase the charge storage devices associated with the pillar 504 above the SGS 670. The access lines 620 in the block 510 are left floating and rise to approximately 20 volts from capacitive coupling with the pillars 504.

Figure 8:
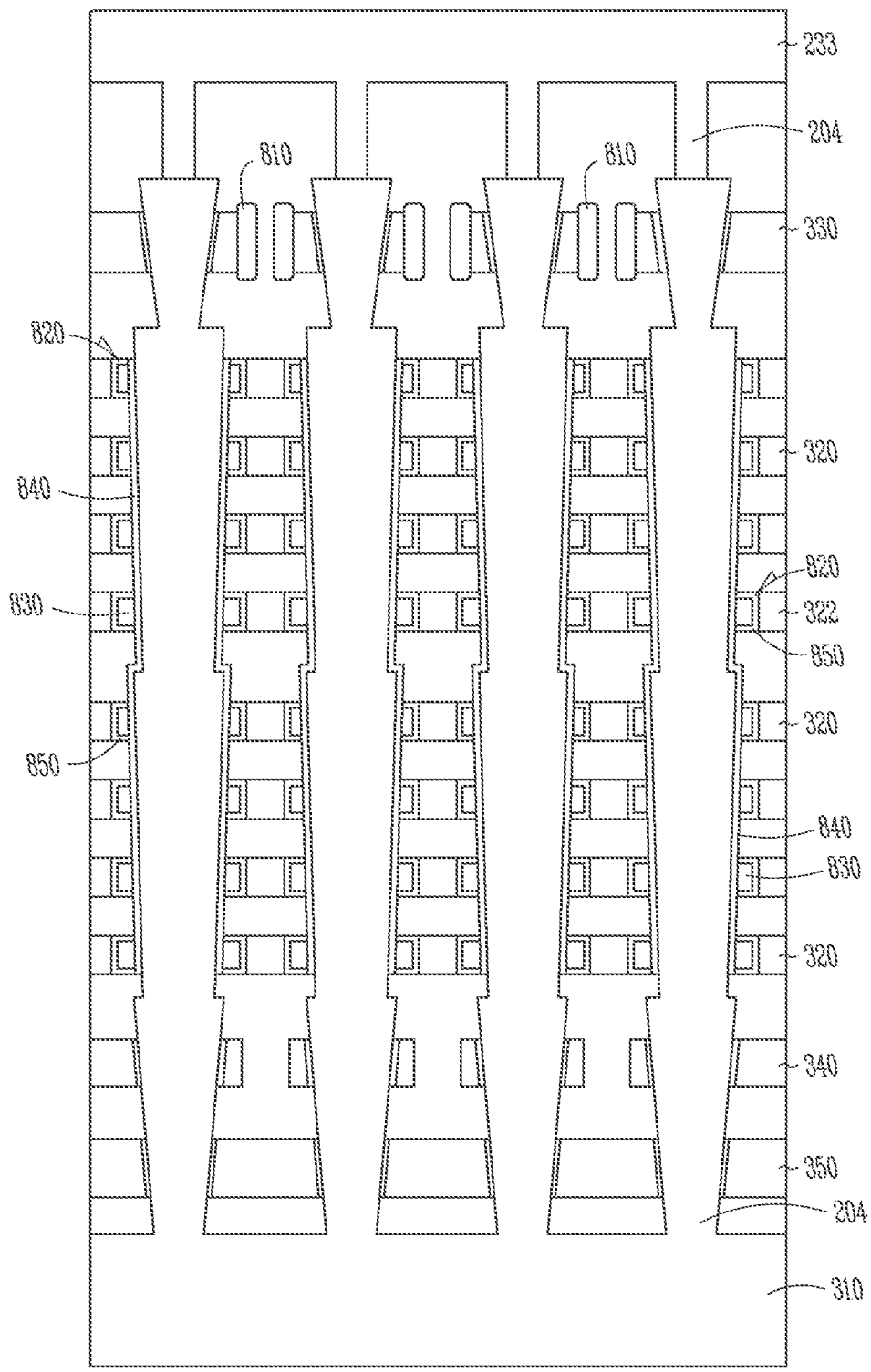
FIG. 8 is a cross-sectional view of a semiconductor construction according to various embodiments of the invention.

FIG. 8 is a cross-sectional view of the semiconductor construction 200 along line 8-8 according to various embodiments of the invention. FIG. 8 illustrates four of the pillars 204 in the block 218 extending from the data line 233 to the p-type silicon well 310 and the tiers including the access lines 320 and 322, the SGDs 330, the SGSs 340 and the source gate 350. Silicon dioxide 810 is formed at edges of the SGDs 330. FIG. 8 illustrates charge storage devices 820 between the access lines 320 and 322 and the pillars 204. Each charge storage device 820 includes a polysilicon storage layer 830 separated from one of the pillars 204 by a tunnel dielectric 840 that can be silicon dioxide. The charge storage layer 830 is separated from the access line 320 or 322 by a blocking dielectric 850 that can include silicon dioxide, silicon nitride ($Si_3N_4$) and silicon dioxide (ONO).

Figure 9:
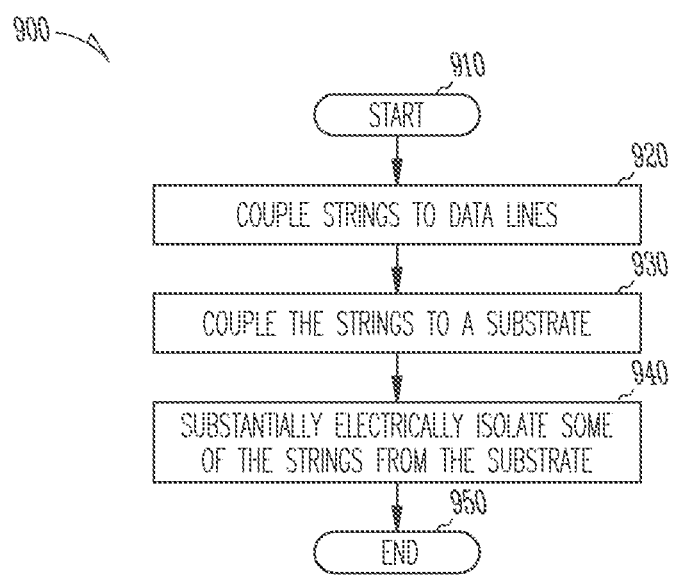
FIG. 9 is a flow diagram of a method according to various embodiments of the invention.

FIG. 9 is a flow diagram of a method 900 according to various embodiments of the invention. In block 910, the method 900 starts. In block 920, strings are coupled to data lines. In block 930, the strings are coupled to a substrate. In block 940, some of the strings are substantially electrically isolated from the substrate. In block 950, the method 900 ends. Various embodiments may have more or fewer activities than those shown in FIG. 9. In some embodiments, the activities may be repeated, and/or performed in serial or parallel fashion. Some embodiments may comprise the same activities in a different order.

Figure 10:
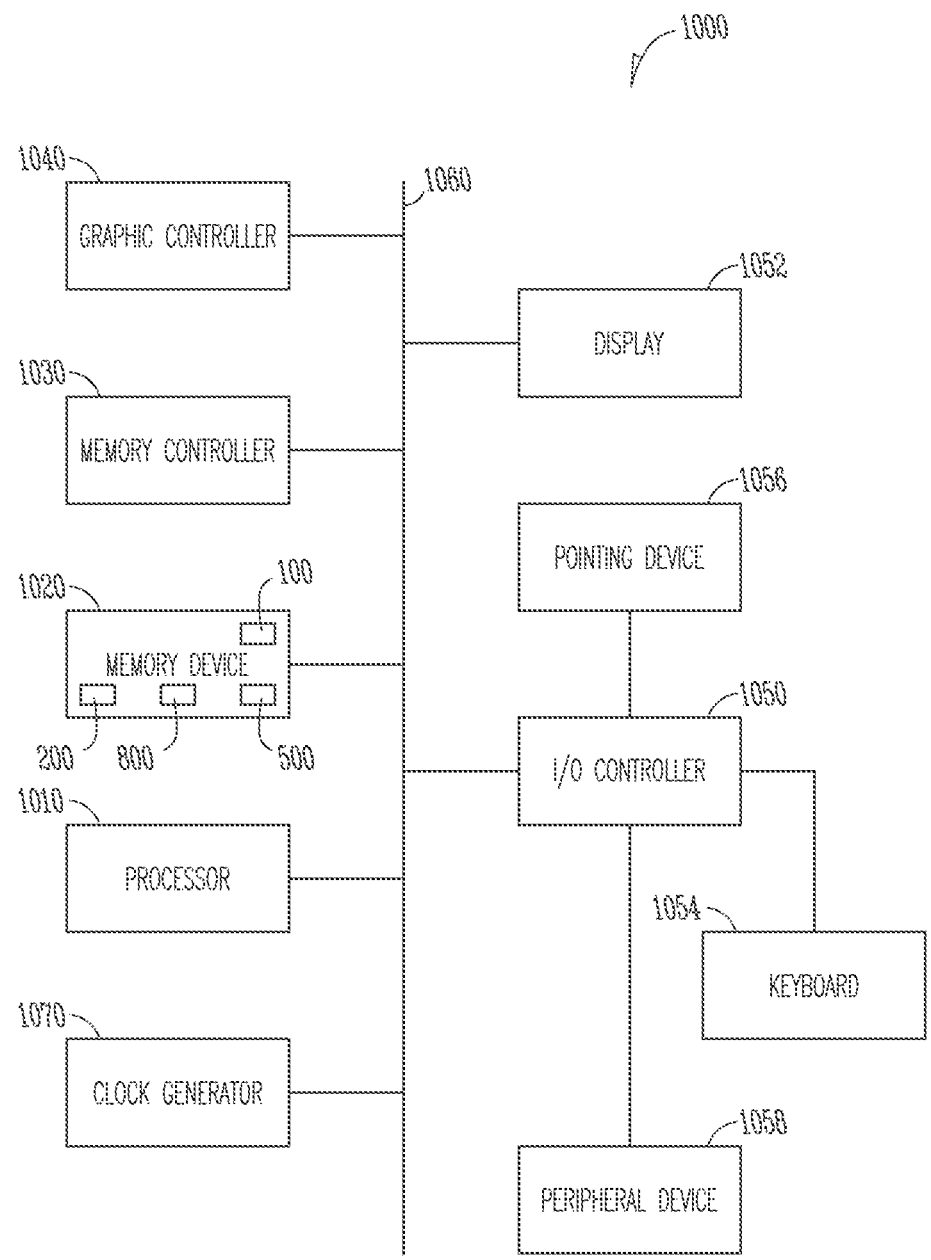
FIG. 10 is a diagram illustrating a system according to various embodiments of the invention.

FIG. 10 is a diagram illustrating a system 1000 according to various embodiments of the invention. The system 1000 may include a processor 1010, a memory device 1020, a memory controller 1030, a graphic controller 1040, an input and output (I/O) controller 1050, a display 1052, a keyboard 1054, a pointing device 1056, and a peripheral device 1058. A bus 1060 couples all of these devices together. A clock generator 1070 is coupled to the bus 1060 to provide a clock signal to at least one of the devices of the system 1000 through the bus 1060. The clock generator 1070 may include an oscillator in a circuit board such as a motherboard. Two or more devices shown in system 1000 may be formed in a single integrated circuit chip. The memory device 1020 may comprise one or more of the block 100 of memory cells described herein and shown in the figures (e.g., see FIGS. 1A and 1B) according to various embodiments of the invention.

The memory device 1020 may comprise one or more of the semiconductor constructions 200, 500 and 800 described herein and shown in the figures according to various embodiments of the invention. The bus 1060 may be interconnect traces on a circuit board or may be one or more cables. The bus 1060 may couple the devices of the system 1000 by wireless means such as by electromagnetic radiations, for example, radio waves. The peripheral device 1058 coupled to the I/O controller 1050 may be a printer, an optical device such as a CD-ROM and a DVD reader and writer, a magnetic device reader and writer such as a floppy disk driver, or an audio device such as a microphone.

The system 1000 represented by FIG. 10 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Charge storage devices in NAND memory devices can be subject to read disturb stress during read operations. The inventors have discovered that the challenges noted above, as well as others, can be addressed with, for example, a source gate device coupled to strings between one or more source select devices and a well in a substrate. Read disturb stress can be substantially reduced by turning off the source select devices in deselected strings during a read operation to substantially electrically isolate the deselected strings from the well in the substrate to substantially prevent conduction between the deselected strings and the well. A conductive member coupled to the substrate can reduce resistance to current flow in the well in the substrate.

Example structures and methods of fabricating semiconductor devices have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A memory device, comprising:
multiple blocks of strings of memory cells, each string of memory cells comprising multiple charge storage devices associated with a respective semiconductor channel material, wherein the multiple strings of memory cells within respective blocks of memory cell strings are arranged in rows and columns, each of the multiple strings coupled to a common source through both a source gate and a source select gate, wherein the multiple blocks of memory cell strings each include respective sub-blocks of memory cell strings;
wherein each source gate of the multiple memory cell strings in a block includes a respective control gate, wherein the multiple control gates of the source gates of the block are coupled together to be controlled in common; and
wherein each source select gate (SGS) of the multiple strings in a respective sub-block of the multiple strings includes a respective control gate, and wherein the control gates of the multiple SGSs within respective sub-blocks are coupled together to be controlled in common, wherein the multiple strings within each sub-block are less than all of the multiple strings of the respective block.

2. The memory device of claim 1, further comprising multiple drain select gates (SGDs), each SGD associated with a respective string of the multiple strings of charge storage devices, each SGD having a control gate, and
wherein the control gates of the SGDs associated with multiple memory cell strings within individual sub-blocks of memory cell strings are coupled to one another to be controlled in common.

3. The memory device of claim 2, wherein the memory device is configured to perform a read operation on a selected memory cell within a first sub-block of multiple strings of memory cells, the first sub-block within a first block of memory cell strings through operations comprising,
biasing the common source to a first voltage;
controlling the source gates within the first block to an "on" state with a first voltage; and
controlling the SGSs of the first sub-block containing the selected memory cell to an "on" state with a second voltage, while controlling SGSs of additional sub-blocks within the first block to an "off" state with a third voltage.

4. The memory device of claim 3, wherein the operations for performing the read operation further comprise:
applying a fourth conductive voltage to multiple access lines in the first block associated with non-selected memory cells; and
sequentially applying multiple read voltages to an access line in the first block associated with the selected memory cell.

5. The memory device of claim 4, wherein the operations for performing the read operation further comprise controlling the SGDs in the first sub-block to an "on" state with a fifth voltage; and
controlling the SGDs of other sub-blocks within the first block to an "off" state with a sixth of voltage.

6. The memory device of claim 3, wherein the first voltage applied to the source gates of the first block is greater than the second voltage applied to the source select gates (SGSs) of the first sub-block.

7. The memory device of claim 5, wherein the second voltage applied to control the SGSs of the first sub-block to an "on" state is the same as the fifth voltage applied to control the SGDs in the first sub-block to an "on" state.

8. The memory device of claim 1, wherein each source gate at least partially surrounds the semiconductor channel material of the string of charge storage devices with which the source gate is associated.

9. The memory device of claim 1, wherein each source select gate at least partially surrounds the semiconductor channel material of the string of charge storage devices with which the source select gate is associated.

10. The memory device of claim 1, wherein each source select gate is between multiple charge storage devices of the respective string and the source gate associated with the respective string.

11. The memory device of claim 1, wherein a first sub-block comprises only strings in a single column of the block.

12. The memory device of claim 11, wherein a first sub-block comprises all strings in a single column of the block.

13. The memory device of claim 1, wherein each block of memory cell strings comprises four sub-blocks of memory cell strings.

14. The memory device of claim 1, wherein each string of memory cells extends vertically, with each charge storage device of the memory cells in a string formed in a respective tier of multiple vertically arranged tiers, and wherein each charge storage device includes a gate; and wherein each tier comprises a respective access line, wherein each access line is coupled to gates of multiple charge storage devices in the respective tier, including a single charge storage device gate from each of multiple memory cell strings within the block.

15. A method of operating memory device, comprising:

a block of vertical strings of memory cells, each string of memory cells comprising multiple charge storage devices connected in series and associated with a respective semiconductor channel material, each of the multiple strings coupled to a common source through both a source gate and a source select gate (SGS), wherein each of the multiple strings is coupled to a respective data line through a select gate drain (SGD), and wherein the multiple blocks of memory cell strings each include respective sub-blocks of memory cell strings;

wherein each source gate of the multiple memory cell strings in a block includes a respective control gate, wherein multiple control gates of the source gates of the block are coupled together to be controlled in common;

wherein each SGS of a respective sub-block of the multiple strings includes a respective control gate, and wherein the multiple control gates of the SGSs within respective sub-blocks are coupled together to be controlled in common, wherein the multiple strings within each sub-block are less than all of the multiple strings of the respective block; and wherein the method comprises:

performing a read operation on a selected memory cell within a first sub-block of multiple strings of charge storage devices within the block through operations comprising, biasing the common source to a first voltage;

controlling the source gates within the first block to an "on" state with a first voltage; and controlling the SGSs of the first sub-block containing the selected memory cell to an "on" state with a second voltage, while controlling SGSs of additional sub-blocks within the first block to an "off" state with a third voltage;

controlling the SGDs in the first sub-block to an "on" state with a fourth voltage; and controlling the SGDs of other sub-blocks within the block to an "off" state with a fifth voltage.

16. The method of claim 15, further comprising:

applying a sixth conductive voltage to multiple access lines in the block associated with non-selected memory cells; and sequentially applying multiple read voltages to an access line in the block associated with the selected memory cell.

17. The method of claim 16, wherein the first voltage applied to the source gates of the first block is greater than the second voltage applied to the (SGSs) of the first sub-block.

18. The method of claim 17, wherein the second voltage applied to control the SGSs of the first sub-block to an "on" state is the same as the fifth voltage applied to control the SGDs in the first sub-block to an "on" state.

19. The method of claim 15, wherein each string of charge storage devices extends vertically, with each charge storage device in a string formed in a respective tier of multiple vertically arranged tiers, and wherein each charge storage device includes a gate; and a respective access line coupled to gates of multiple charge storage devices in the respective tier, including a single charge storage device gate from each of multiple memory cell strings.

20. The method of claim 15, wherein the charge storage devices comprise a respective transistor having a charge trap structure.

* * * * *